United States Patent
Hwang et al.

(10) Patent No.: US 9,853,060 B2
(45) Date of Patent: Dec. 26, 2017

(54) THIN FILM TRANSISTOR SUBSTRATE AND METHOD OF MANUFACTURING THE SAME

(71) Applicant: SAMSUNG DISPLAY CO., LTD., Yongin, Gyeonggi-Do (KR)

(72) Inventors: Tae-Hyung Hwang, Seoul (KR); Won-Ho Kim, Seongnam-si (KR); Seong-Su Lim, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 13 days.

(21) Appl. No.: 14/707,287

(22) Filed: May 8, 2015

(65) Prior Publication Data
US 2016/0126256 A1    May 5, 2016

(30) Foreign Application Priority Data
Oct. 31, 2014  (KR) .................. 10-2014-0150690

(51) Int. Cl.
*H01L 27/12* (2006.01)
*H01L 23/552* (2006.01)
(Continued)

(52) U.S. Cl.
CPC ...... *H01L 27/124* (2013.01); *G02F 1/134363* (2013.01); *G02F 1/136227* (2013.01);
(Continued)

(58) Field of Classification Search
CPC ..................... H01L 23/552; G09G 2300/04
See application file for complete search history.

(56) References Cited

U.S. PATENT DOCUMENTS 8,421,942 B2 * 4/2013 Tsubata ............... G02F 1/13624
349/43
2006/0208984 A1 * 9/2006 Kim .................... G09G 3/3648
345/90
(Continued)

FOREIGN PATENT DOCUMENTS

JP   2013-246410 A   12/2013
KR  10-2008-0046876 A   5/2008
(Continued)

*Primary Examiner* — Lex Malsawma
*Assistant Examiner* — Xia Cross
(74) *Attorney, Agent, or Firm* — Lee & Morse, P.C.

(57) ABSTRACT

A TFT substrate including a base substrate that includes a plurality of pixel areas; a gate line on the base substrate and extending in a first direction; a data line on the gate line and extending in a second direction; a TFT connected to the gate line and the data line, the TFT including a gate electrode, a semiconductor pattern, and source and drain electrodes, the semiconductor pattern overlapping the gate electrode, the source electrode and the drain electrode overlapping the semiconductor pattern, and the drain electrode being spaced apart from the source electrode; an inorganic insulating pattern covering the data line, the inorganic insulating pattern including an opening aligned with the pixel areas; a shielding electrode overlapping the data line, the shielding electrode on the inorganic insulating pattern; and a pixel electrode on the pixel areas, the pixel electrode being electrically connected to the drain electrode through a first contact hole.

13 Claims, 9 Drawing Sheets

(51) Int. Cl.
*G02F 1/1343* (2006.01)
*G02F 1/1362* (2006.01)

(52) U.S. Cl.
CPC ........ H01L 23/552 (2013.01); H01L 27/1259 (2013.01); *G02F 2001/136218* (2013.01); *G09G 2300/04* (2013.01)

(56) References Cited

U.S. PATENT DOCUMENTS

| | | | |
|---|---|---|---|
| 2006/0286703 A1* | 12/2006 | Um | G02F 1/13624 438/30 |
| 2008/0122775 A1 | 5/2008 | Kim et al. | |
| 2010/0019998 A1* | 1/2010 | You | G02F 1/133707 345/87 |
| 2012/0008059 A1* | 1/2012 | Kim | G02F 1/134363 349/42 |

FOREIGN PATENT DOCUMENTS

| | | |
|---|---|---|
| KR | 10-2012-0003769 A | 1/2012 |
| KR | 10-2012-0051964 A | 5/2012 |
| KR | 10-2012-0115837 A | 10/2012 |

\* cited by examiner

THIN FILM TRANSISTOR SUBSTRATE AND METHOD OF MANUFACTURING THE SAME

CROSS-REFERENCE TO RELATED APPLICATION

Korean Patent Application No. 10-2014-0150690, filed on Oct. 31, 2014, in the Korean Intellectual Property Office, and entitled: "Thin Film Transistor Substrate and Method Of Manufacturing the Same," is incorporated by reference herein in its entirety.

BACKGROUND

1. Field

Embodiments relate to a thin-film transistor substrate and a method of manufacturing the thin-film transistor substrate.

2. Description of the Related Art

A liquid crystal display apparatus is one type of a flat panel display FPD, which is broadly used. Examples of the flat panel display may include a liquid crystal display ("LCD"), a plasma display panel ("PDP"), and an organic light emitting display ("OLED").

The liquid crystal display apparatus applies voltages to molecules of liquid crystal to adjust arrangements of the molecules thereby changing optical characteristics of a liquid crystal cell such as birefringence, optical activity, dichroism, and light scattering to display an image.

The liquid crystal display apparatus may include an array substrate including a pixel electrode, a color filter substrate including a common electrode, and a liquid crystal layer between the substrates. An electric field is generated between the pixel electrode and the common electrode, a transimissivity of each pixel may be controlled by arrangements of the liquid crystal layer which is changed by the electric field thus displaying an image.

SUMMARY

Embodiments are directed to a thin-film transistor substrate and a method of manufacturing the thin-film transistor substrate.

The embodiments may be realized by providing a thin-film transistor substrate, including a base substrate that includes a plurality of pixel areas; a gate line on the base substrate, the gate line extending in a first direction; a data line on the gate line, the data line extending in a second direction that crosses the first direction; a thin-film transistor connected to the gate line and the data line, the thin-film transistor including a gate electrode, a semiconductor pattern, a source electrode, and a drain electrode, the semiconductor pattern overlapping with the gate electrode, the source electrode and the drain electrode overlapping with the semiconductor pattern, and the drain electrode being spaced apart from the source electrode; an inorganic insulating pattern covering the data line, the inorganic insulating pattern including an opening aligned with the pixel areas; a shielding electrode overlapping with the data line, the shielding electrode being on the inorganic insulating pattern; and a pixel electrode on the pixel areas, the pixel electrode being electrically connected to the drain electrode through a first contact hole.

The inorganic insulating pattern may have a thickness of about 8,000 Å to about 10,000 Å.

The inorganic insulating pattern may include silicon oxide or silicon nitride.

The thin-film transistor substrate may further include a gate insulating layer covering the gate line and the gate electrode.

The gate insulating layer may have a thickness of about 3,000 Å to about 5,000 Å.

The thin-film transistor substrate may further include a passivation layer covering the shielding electrode and the thin-film transistor.

The passivation layer may have a thickness of about 1,000 Å to about 3,000 Å.

The shielding electrode may include a material that is substantially the same as that of the pixel electrode.

The shielding electrode and the pixel electrode may include indium tin oxide, indium zinc oxide, or aluminum-doped zinc oxide.

The shielding electrode and the pixel electrode may be formed on different layers.

The pixel electrode may have a slit pattern.

The thin-film transistor substrate may further include a gate pad electrode connected to the gate line; a gate insulating layer on the gate pad electrode; a passivation layer on the gate insulating layer; and a bridge electrode on the passivation layer, wherein the bridge electrode is electrically connected to the gate pad electrode through a second contact hole.

The thin-film transistor substrate may further include a common electrode overlapping with the pixel electrode.

The embodiments may be realized by providing a method of manufacturing a thin-film transistor substrate, the method including forming a gate pattern on a base substrate, the base substrate including a plurality of pixel areas, the gate pattern including a gate line and a gate electrode, and the gate line extending in a first direction; forming a data pattern such that the data pattern includes a data line, a source electrode, and a drain electrode, the data line extending in a second direction that crosses the first direction, the source electrode and the drain electrode overlapping with the gate electrode, and the drain electrode being spaced apart from the source electrode; forming an inorganic insulating layer by depositing an inorganic insulating material on the base substrate; forming a shielding electrode on the inorganic insulating layer by using a photo pattern as a mask such that the shielding electrode overlaps with the data line; forming an inorganic insulating pattern that covers the data line by etching the inorganic insulating layer such that etching of the inorganic insulating layer includes using the photo pattern and the shielding electrode as a mask; forming a passivation layer by depositing the inorganic insulating material on the base substrate such that the passivation layer covers the shielding electrode, the source electrode, and the drain electrode; forming a first contact hole by etching the passivation layer such that the first contact hole exposes the drain electrode; and forming a pixel electrode that is electrically connected to the drain electrode through the first contact hole.

The inorganic insulating layer may be formed with a thickness of about 8,000 Å to about 10,000 Å.

The inorganic insulating material may include silicon oxide or silicon nitride.

The method may further include forming a gate insulating layer by depositing the inorganic insulating material on the base substrate such that the gate insulating layer covers the gate pattern.

The gate insulating layer may be formed with a thickness of about 3,000 Å to about 5,000 Å.

The passivation layer may be formed with a thickness of about 1,000 Å to about 3,000 Å.

The gate pattern may include a gate pad electrode connected to the gate line, and the method may further include forming a gate insulating layer on the gate pad electrode; forming a passivation layer on the gate insulating layer; forming a second contact hole by etching the gate insulating layer and the passivation layer such that the second contact hole exposes the gate pad electrode; and forming a bridge electrode that is electrically connected to the gate pad electrode through the second contact hole.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "on", "connected" or "coupled" to another element, it can be directly on, connected, or coupled to the other element or intervening elements may be present. In contrast, when an element is referred to as being "directly on", "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
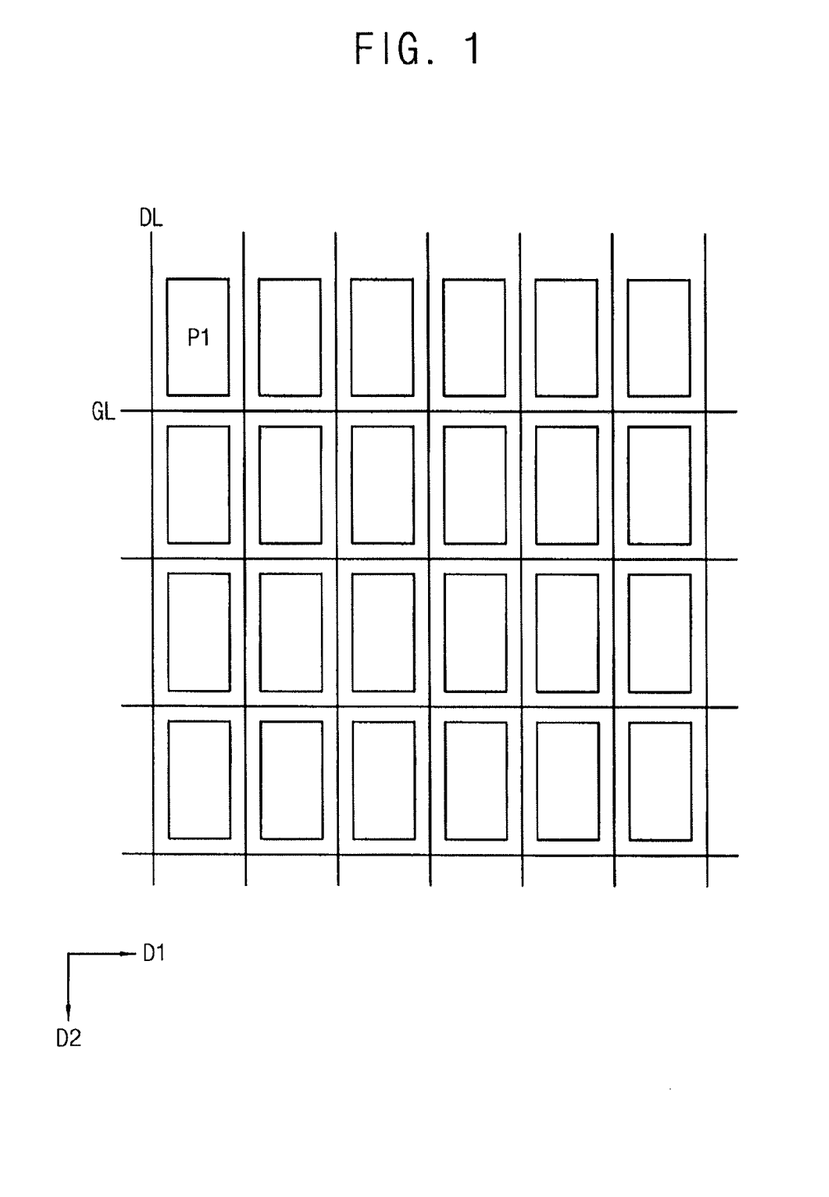
FIG. 1 illustrates a plan view of a display panel according to example embodiments.
Figure 2:
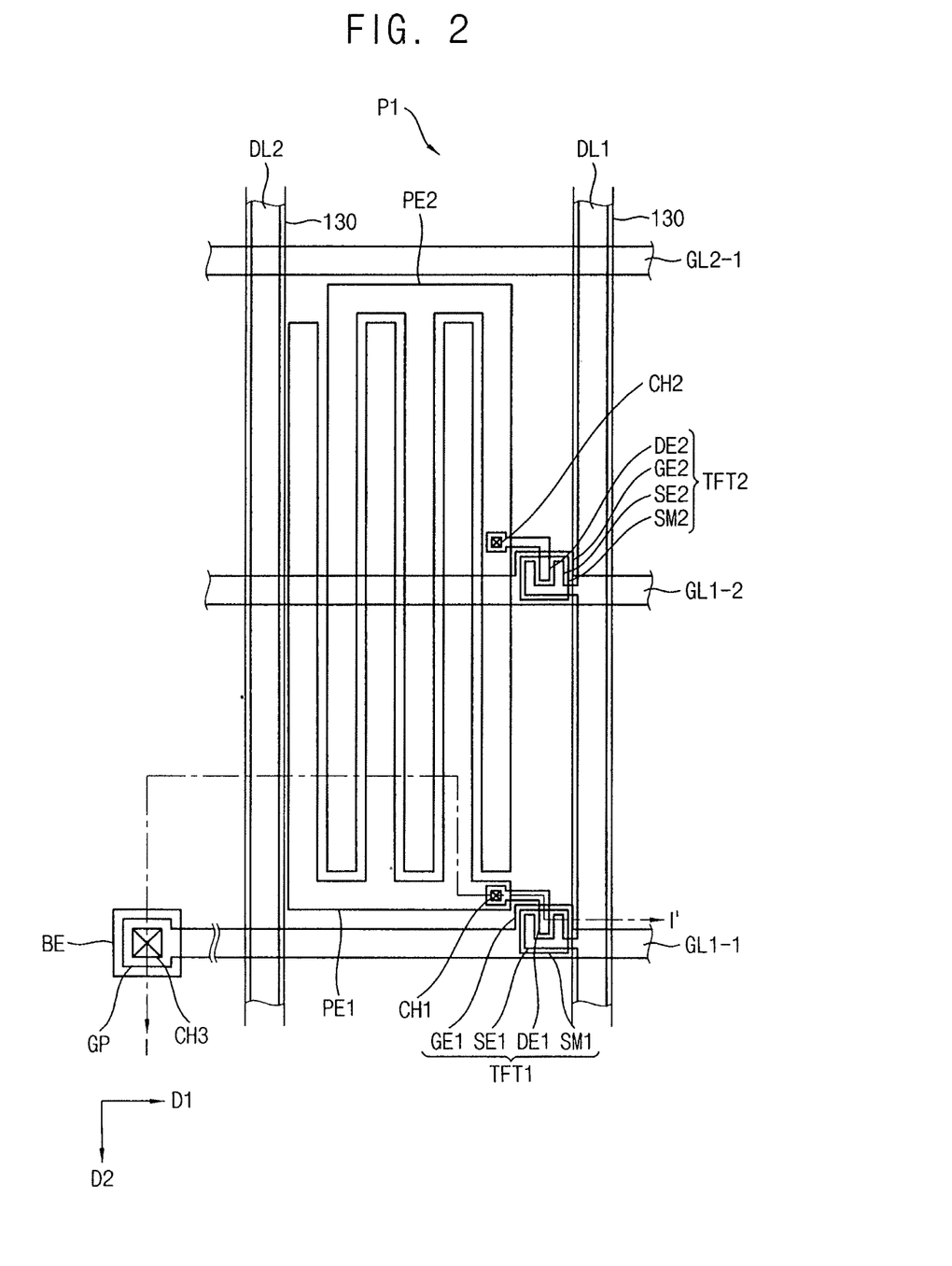
FIG. 2 illustrates a plan view of a first pixel included in the display panel of FIG. 1.
Figure 3:
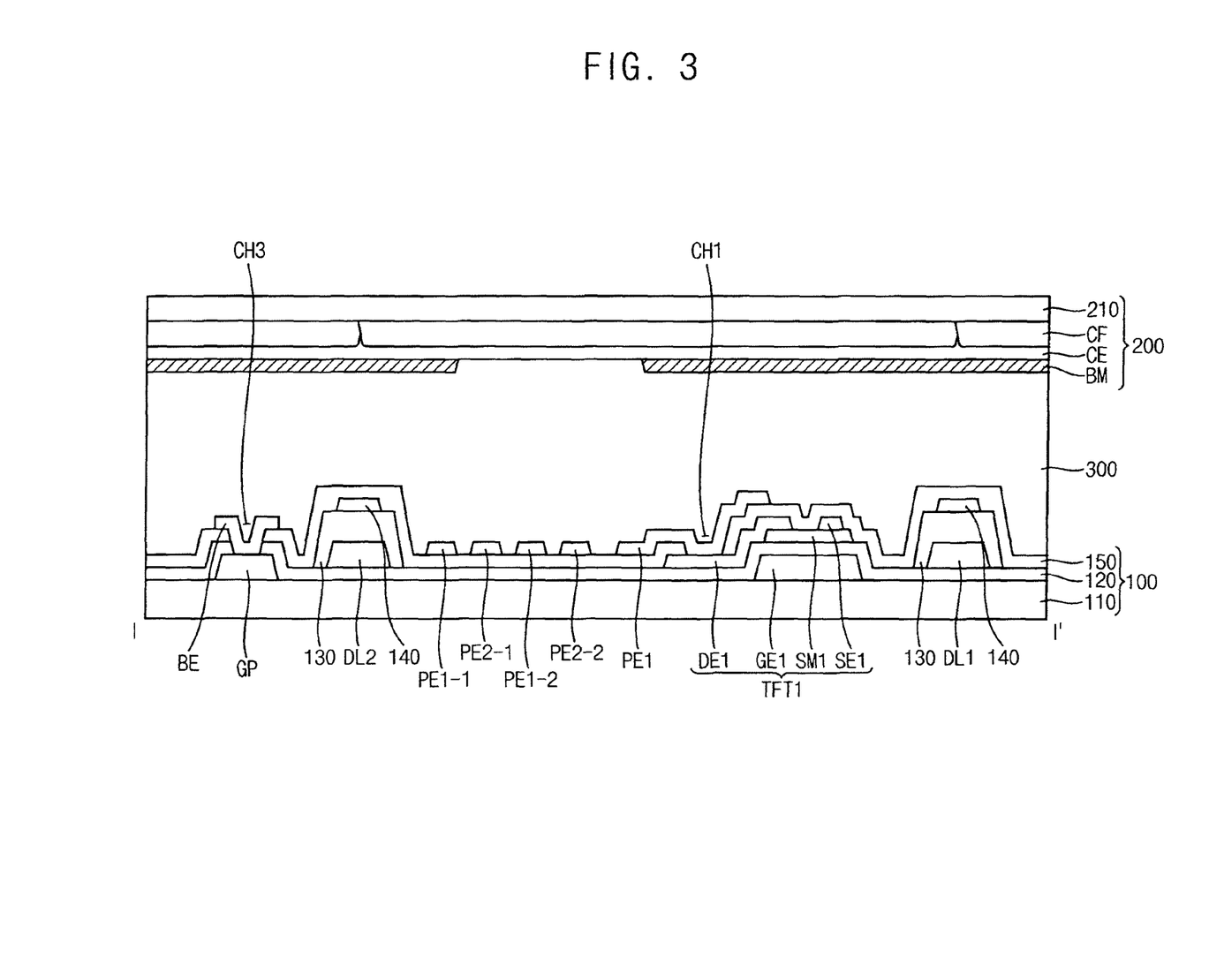
FIG. 3 illustrates a cross-sectional view of the display panel taken along the line I-I' of FIG. 2.

FIG. 1 illustrates a plan view of a display panel according to example embodiments. FIG. 2 illustrates a plan view of a first pixel included in the display panel of FIG. 1. FIG. 3 illustrates a cross-sectional view of the display panel taken along the line I-I' of FIG. 2.

Referring to FIGS. 1, 2, and 3, the display panel may include a plurality of gate lines GL, a plurality of data lines DL, and a plurality of pixels.

The plurality of gate lines GL may extend in a first direction D1, and the plurality of data lines DL may extend in a second direction D2 crossing (e.g., substantially perpendicular to) the first direction D1. In an implementation, the plurality of gate lines GL may extend in the second direction D2, and the plurality of data lines DL may extend in the first direction D1.

The plurality of pixels may be arranged in a matrix form. The plurality of pixels may be disposed in a plurality of pixel areas that are defined by the plurality of gate lines GL and the plurality of data lines DL.

Each pixel may be connected to a respective one of the gate lines (e.g., an adjacent one gate line) and a respective one of the data lines (e.g., an adjacent one data line).

For example, a first pixel P1 may be connected to two gate lines GL1-1, GL1-2 and a data line DL1.

For example, each pixel may have a rectangular shape, a V shape, a Z shape, or the like.

The display panel may include a first substrate 100, a second substrate 200, and a liquid crystal layer 300.

The first substrate 100 may include a first base substrate 110, a first thin film transistor TFT1, a second thin film transistor TFT2, a gate insulating layer 120, a data line DL, an inorganic insulating pattern 130, a shielding electrode 140, a passivation layer 150, and a pixel electrodes PE1 and PE2.

The first base substrate 110 may be a transparent insulating substrate. For example, the first base substrate 110 may be a glass substrate or a transparent plastic substrate. The first base substrate 110 may include a plurality of pixel areas displaying an image. The pixel areas may be arranged in a matrix form having a plurality of columns and rows. The pixel areas may be defined by the gate lines GL and the data lines DL.

Each pixel may include a switching element. For example, the thin film transistor TFT may be the switching element. The thin film transistors may be connected to the respective one of the gate lines (e.g., the adjacent one gate line) and the respective one of the data lines (e.g., the adjacent one data line). The thin film transistors may be disposed on an area where the gate line GL and the data line DL intersect.

For example, each pixel may include a plurality of thin film transistors TFT1 and TFT2. For example, a first thin film transistor TFT1 may be connected to a first gate line GL1-1 and a data line DL1. A second thin film transistor TFT2 may be connected to a second gate line GL1-2 and a data line DL1.

The first thin film transistor TFT1 and the second thin film transistor TFT2 may have substantially the same structure. Thus, the first thin film transistor TFT1 will be described in detail below.

A gate pattern may be disposed on the first base substrate 110. The gate pattern may include a first gate electrode GE1, a first gate line GL1-1, and the gate pad electrode GP. The first gate line GL1-1 may be electrically connected to the first gate electrode GE1. The first gate line GL1-1 may be electrically connected to the gate pad electrode GP.

The gate insulating layer 120 may be disposed on the first base substrate 110 where the gate pattern is disposed, and may cover the gate pattern. The gate insulating layer 120 may insulate the gate pattern.

A first semiconductor pattern SM1 may be formed on the gate insulating layer 120. The first semiconductor pattern SM1 may overlap with the first gate electrode GE1.

A data pattern may be disposed on the gate insulating layer 120 where the first semiconductor pattern SM1 is formed. The data pattern may include a data line DL1, a first source electrode SE1, and a first drain electrode DE1. The first source electrode SE1 may overlap with the first semiconductor pattern SM1, and may be electrically connected to the data line DL1.

The first drain electrode DE1 may be spaced apart from the first source electrode SE1 on the first semiconductor pattern SM1. The first semiconductor pattern SM1 may form a conductive channel between the first source electrode SE1 and the first drain electrode DE1.

The first thin film transistor TFT1 may include the first gate electrode GE1, the first source electrode SE1, the first drain electrode DE1, and the first semiconductor pattern SM1.

The gate insulating layer 120 may include an inorganic insulating material. For example, the gate insulating layer 120 may include silicon oxide (SiOx) or silicon nitride (SiNx).

The gate insulating layer 120 may have a thickness of about 3,000 Å to about 5,000 Å. Maintaining the thickness of the gate insulating layer 120 at about 3,000 Å or greater may help ensure that the gate pattern is sufficiently insulated. Maintaining the thickness of the gate insulating layer 120 at about 5,000 Å or less may help ensure that an overall thickness of the display panel does not excessively increase, may help ensure that an inorganic insulating layer does not become excessively thick, and may help facilitate etching and removal of the inorganic insulating layer.

The inorganic insulating pattern 130 may cover the data line DL1. The inorganic insulating pattern 130 may be disposed on the data line DL1, and may include an opening overlapping with or aligned with the pixel areas. Thus, a thickness of the inorganic insulating layer disposed on the pixel areas may be reduced.

The shielding electrode 140 may be disposed on the inorganic insulating pattern 130. The shielding electrode 140 may overlap with the data line DL1.

The shielding electrode 140 may overlap with the data line DL1 to help prevent or reduce a coupling capacitance between the data line DL1 and the pixel electrodes PE1 and PE2 or between the data line DL1 and the common electrode CE.

The inorganic insulating pattern 130 may be disposed between the data line DL1 and the shielding electrode 140. A coupling capacitance between the data line DL1 and the shielding electrode 140 may be reduced based on the inorganic insulating pattern 130, and thus a delay of a data signal may be reduced.

The inorganic insulating pattern 130 may have a thickness of about 8,000 Å to about 10,000 Å. Maintaining the thickness of the inorganic insulating pattern 130 at about 8,000 Å or greater may help facilitate the reduction in the coupling capacitance. Maintaining the thickness of the inorganic insulating pattern 130 at about 10,000 Å or less may help prevent an excessive increase in an overall thickness of the display panel increases, may help prevent an excessive increase in a thickness of an inorganic insulating layer, and may facilitate etching and removal of the inorganic insulating layer.

The passivation layer 150 may be disposed on the first thin film transistor TFT1 and the shielding electrode 140, and may cover the first thin film transistor TFT1 and the shielding electrode 140. The passivation layer 150 may insulate the first thin film transistor TFT1 and the shielding electrode 140.

The passivation layer 150 may be disposed on the gate pad electrode GP, the first gate line GL1-1, the data line DL1, and the first thin film transistor TFT1.

The passivation layer 150 may include an inorganic insulating material. For example, the passivation layer 150 may include silicon oxide (SiOx) or silicon nitride (SiNx).

The passivation layer 150 may have a thickness of about 1,000 Å to about 3,000 Å. Maintaining the thickness of the passivation layer 150 at about 1,000 Å or greater may help ensure that the shielding electrode 140 and the thin film transistor are sufficiently insulated. Maintaining the thickness of the passivation layer 150 at about 3,000 Å or less may help ensure that an overall thickness of the display panel is not excessively increased, may help ensure that a thickness of an inorganic insulating layer does not excessively increase, and may facilitate etching and removal of the inorganic insulating layer.

The pixel electrodes PE1 and PE2 may be disposed on the passivation layer 150.

The first pixel electrode PE1 may be electrically connected to the first drain electrode DE1 of the first thin film transistor TFT1 through a first contact hole CH1. A grayscale voltage may be applied to the first pixel electrode PE1 through the first drain electrode DE1 of the first thin film transistor TFT1.

The second pixel electrode PE2 may be electrically connected to the second drain electrode DE2 of the second thin film transistor TFT2 through a second contact hole CH2. A grayscale voltage may be applied to the second pixel electrode PE2 through the second drain electrode DE2 of the second thin film transistor TFT2.

The pixel electrodes PE1 and PE2 may overlap with the pixel areas. The pixel electrodes PE1 and PE2 may be disposed in the pixel area. For example, the pixel electrodes PE1 and PE2 may be disposed between adjacent two data lines DL1 and DL2.

In an implementation, the pixel electrodes PE1 and PE2 may include a transparent conductor, e.g., indium tin oxide (ITO), indium zinc oxide (IZO), or aluminum-doped zinc oxide (AZO).

In an implementation, the pixel electrodes PE1 and PE2 may each include a material that is substantially the same as that of the shielding electrode 140.

For example, the shielding electrode 140 may be formed on a different layer from the pixel electrodes PE1 and PE2.

The passivation layer 150 may be disposed between the shielding electrode 140 and the pixel electrodes PE1 and PE2.

In an implementation, the pixel electrodes PE1 and PE2 may have a slit pattern.

A bridge electrode BE may be disposed on the passivation layer 150.

The bridge electrode BE may be electrically connected to the gate pad electrode GP through a third contact hole CH3. In an implementation, the bridge electrode BE may include a material that is substantially the same as that of the pixel electrodes PE1 and PE2.

The second substrate 200 may include a second base substrate 210, a color filter CF, a common electrode CE, and a black matrix BM.

The second base substrate 210 may be a transparent insulating substrate. For example, the second base substrate 210 may be a glass substrate or a transparent plastic substrate.

The color filter CF may be disposed on the second base substrate 210. For example, one color filter CF may be disposed between two adjacent data lines.

The color filter CF may color the light passing through the liquid crystal layer 300. For example, the color filter CF may be a red color filter, a green color filter, or a blue color filter.

The color filter CF may be disposed corresponding to or aligned with each of the pixel areas. A first color filter on or aligned with a first pixel may have a different color from a second color filter on or aligned with a second pixel (adjacent to the first pixel).

The first color filter may overlap with the second color filter adjacent to the first color filter at a boundary of adjacent pixel areas. In an implementation, the color filter CF may be spaced apart from the boundary of the adjacent pixel areas along a first direction D1. For example, the color filter CF may be disposed in an island form along the first direction D1 with the data lines being the boundary.

The common electrode CE may be disposed on the color filter CF.

For example, the common electrode CE may overlap with the data line DL. In this case, the shielding electrode 140 may be formed between the data line DL and the common electrode CE. Thus, a coupling capacitance between the data line DL and the common electrode CE may be reduced.

In an implementation, the common electrode CE may include a transparent conductor, e.g., indium tin oxide (ITO), indium zinc oxide (IZO), or aluminum-doped zinc oxide (AZO).

Thus, a grayscale voltage may be applied to the pixel electrode PE and the common electrode CE to form an electric field.

The pixel electrodes PE1 and PE2 may overlap with the common electrode CE. Thus, the display panel may operate in dual field switching mode by the common electrode CE (where a common voltage is applied) and the pixel electrode PE (where a grayscale voltage is applied).

The black matrix BM may be disposed on the common electrode CE to block light.

The black matrix BM may be disposed corresponding to or aligned with a non-display area of the pixel to block the incident light from the outside.

For example, the black matrix BM may overlap with the gate line GL, the data line DL, and the thin film transistor.

In an implementation, the black matrix BM may contain a black material including, e.g., a metal material having a relatively low transmittance ratio or a photo resist organic material.

For example, the metal material may include molybdenum, titanium, tungsten, or an alloy thereof.

For example, the black material may further include a coloring agent such as carbon black, an organic or inorganic pigment, and/or a color mixed pigment or the like.

The liquid crystal layer 300 may be disposed between the first substrate 100 and the second substrate 200.

The liquid crystal layer 300 may include liquid crystal molecules. An alignment of the liquid crystal molecules in the liquid crystal layer 300 may be controlled by an electric field applied between the common electrode CE and the pixel electrode PE. Therefore, a light transmittance of the pixel may be controlled.

In an implementation, the display panel may include an alignment layer to facilitate aligning of the liquid crystal molecules. For example, the alignment layer may be disposed between the first substrate 100 and the liquid crystal layer 300 or between the second substrate 200 and the liquid crystal layer 300.

The alignment layer may pretilt the liquid crystal molecules of the liquid crystal layer 300.

FIGS. 4A to 4G illustrate plan views of stages in a method of manufacturing a thin film transistor substrate according to example embodiments.

Figure 4A:
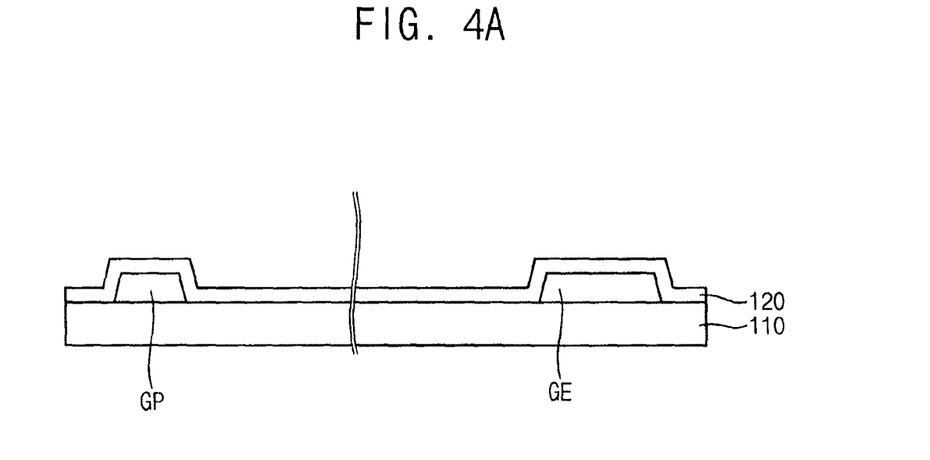
FIGS. 4A to 4G illustrate plan views showing stages in a method of manufacturing a thin film transistor substrate according to example embodiments.

Referring to FIG. 4A, a gate pattern may be formed on a first base substrate 110. The gate pattern may include a gate pad electrode GP, a gate electrode GE and a gate line GL.

A gate insulating layer 120 may be formed by depositing and then etching an inorganic insulating material on the gate pattern.

For example, the inorganic insulating material may include silicon oxide (SiOx) or silicon nitride (SiNx).

Figure 4B:
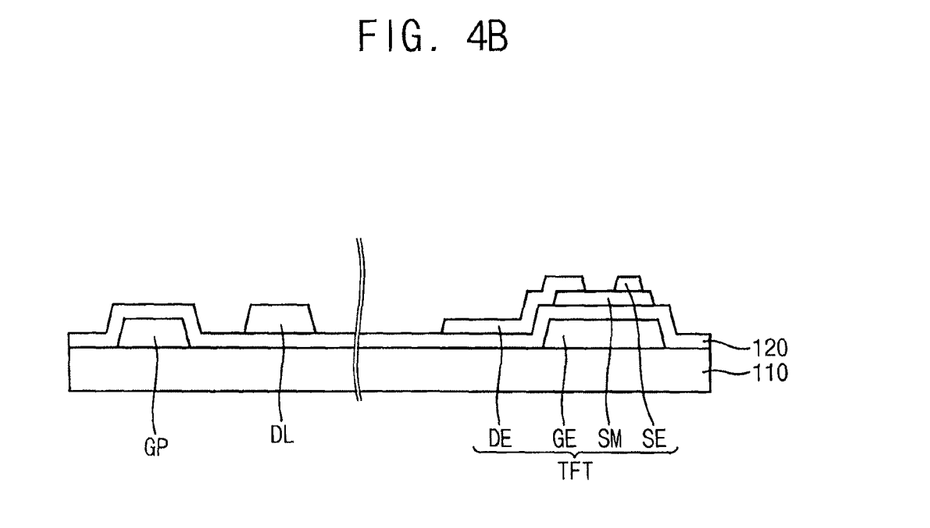

Referring to FIG. 4B, a semiconductor pattern SM may be formed on the gate insulating layer 120. The semiconductor pattern SM may include an oxide semiconductor. In an implementation, the semiconductor pattern SM may include amorphous silicon.

A data pattern may be formed on the gate insulating layer 120. The data pattern may include a data line DL, a source electrode SE, and a drain electrode DE. The source electrode SE and the drain electrode DE may overlap with the semiconductor pattern SM, and may be spaced apart from each other.

Figure 4C:
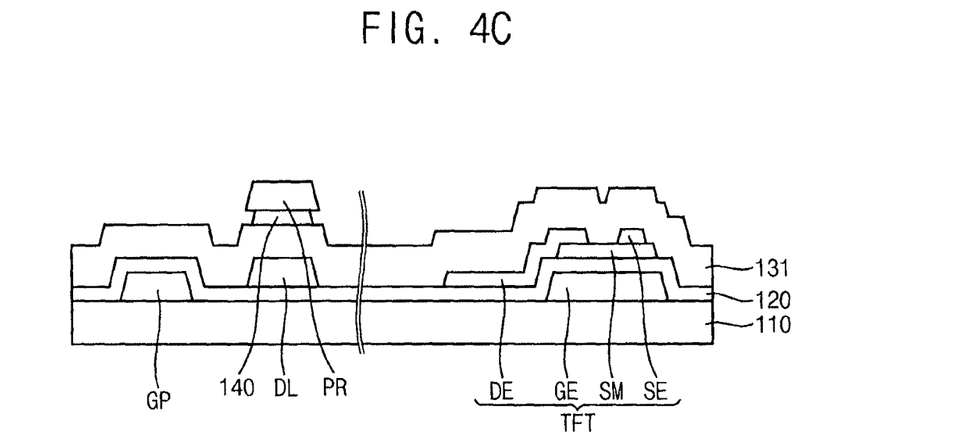

Referring to FIG. 4C, an inorganic insulating layer 131 may be formed by depositing and then etching an inorganic insulating material on the first base substrate 110.

For example, the inorganic insulating material may include silicon oxide (SiOx) or silicon nitride (SiNx).

A shielding electrode layer may be formed by depositing and then etching a transparent conductor on the inorganic insulating layer 131.

For example, the transparent conductor may include indium tin oxide (ITO), indium zinc oxide (IZO), or aluminum-doped zinc oxide (AZO).

A photoresist layer may be formed by coating a photoresist material on the shielding electrode layer and the inorganic insulating layer 131. For example, the photoresist material may include photosensitive organic material. For example, a type of the photoresist material may be negative.

Afterward, an area (except an overlapped area with the data line DL) may be removed to form a photo pattern PR that overlaps with the data line DL. For example, the overlapped area with the data line DL may be exposed and may be developed by using a mask including a transmission part and a light blocking part to form the photo pattern PR.

A shielding electrode 140 (overlapping with the data line) may be formed on the inorganic insulating layer 131 by using the photo pattern PR as a mask. The shielding electrode 140 may be formed by etching the shielding electrode layer. In an implementation, the shielding electrode may be wet-etched.

Figure 4D:
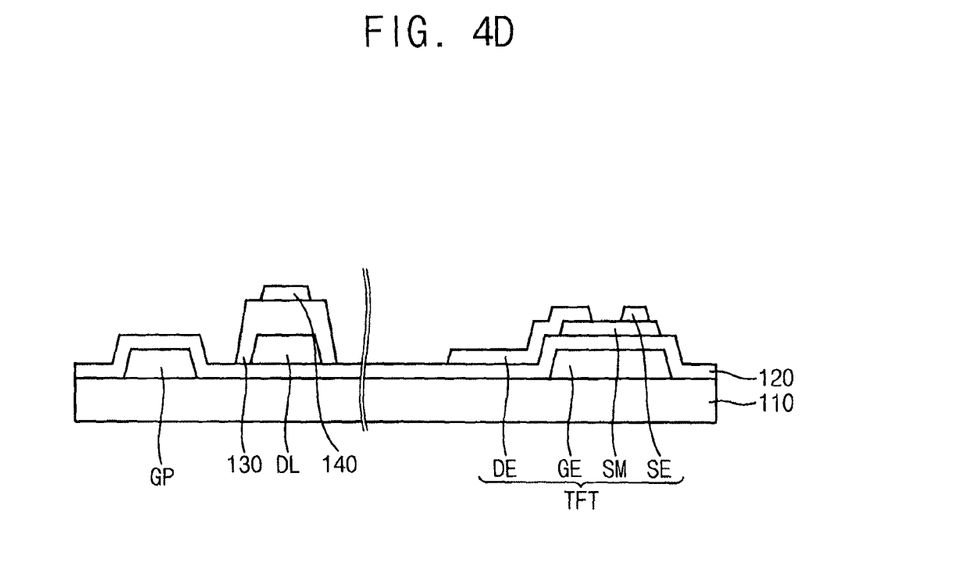

Referring to FIG. 4D, the inorganic insulating layer 131 may be etched by using the photo pattern PR and the shielding electrode 140 as a mask to form an inorganic insulating pattern 130. For example, the inorganic insulating layer 131 may be dry-etched. Afterward, the photo pattern PR may be removed.

Figure 4E:
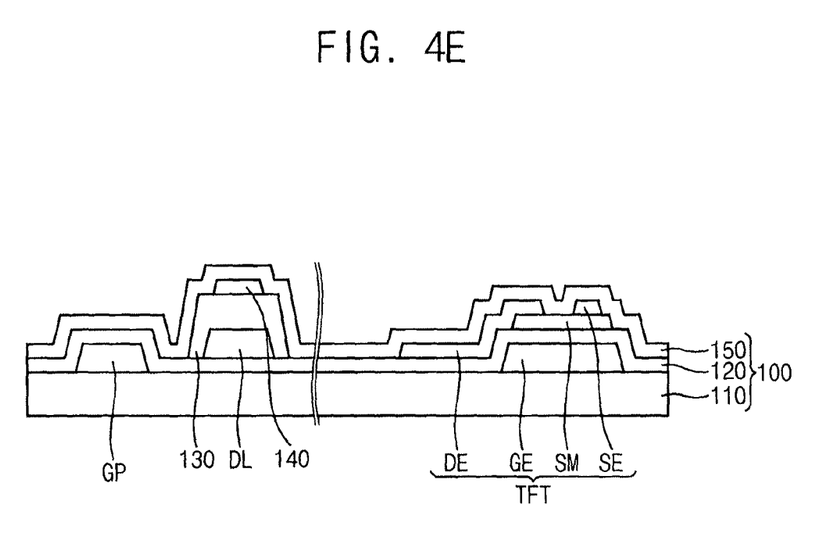

Referring to FIG. 4E, a passivation layer 150 may be formed by depositing and then etching an inorganic insulating material on the first base substrate 110. For example, the inorganic insulating material may include silicon oxide (SiOx) or silicon nitride (SiNx). The passivation layer 150 may cover the shielding electrode 140, the source electrode SE, and the drain electrode DE.

Figure 4F:
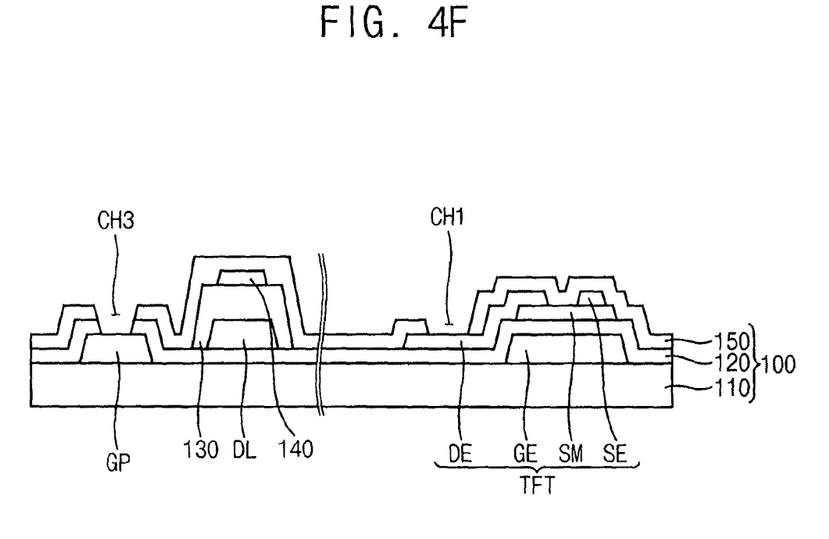

Referring to FIG. 4F, a first contact hole (exposing a part of the drain electrode) may be formed by etching a part of the passivation layer 150.

A third contact hole CH3 (exposing a part of the gate pad electrode GP) may be formed by etching a part of the passivation layer 150 and the gate insulating layer 120 where the gate pad electrode GP is disposed.

The first contact hole CH1 may be etched with substantially the same thickness as the passivation layer 150. For example, the first contact hole CH1 may be etched with a thickness or depth of about 1,000 Å to about 3,000 Å.

The third contact hole CH3 may be etched with substantially the same thickness as the passivation layer 150 and the gate insulating layer 120. For example, the third contact hole CH3 may be etched with a thickness or depth of about 4,000 Å to about 8,000 Å.

Figure 4G:
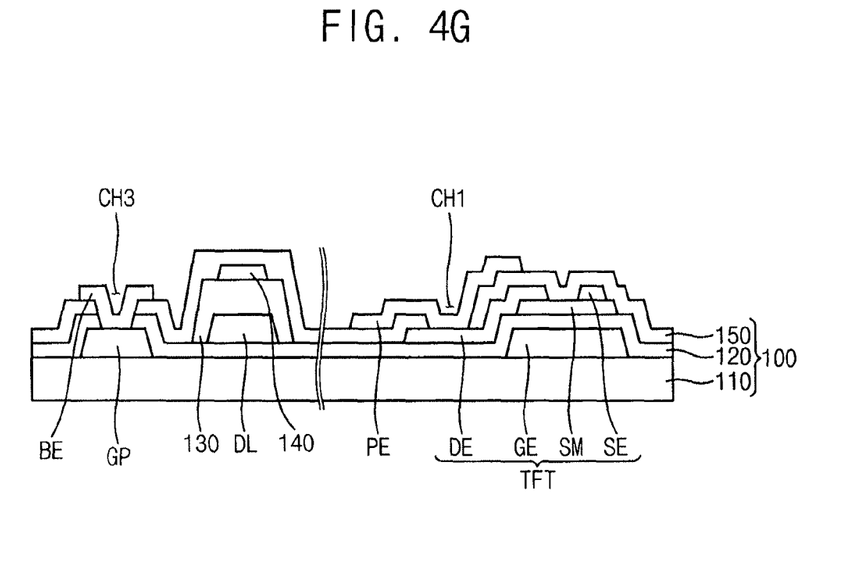

Referring to FIG. 4G, a bridge electrode BE may be formed in the third contact hole CH3, and a pixel electrode PE may be formed in the first contact hole CH1.

Figure 5:
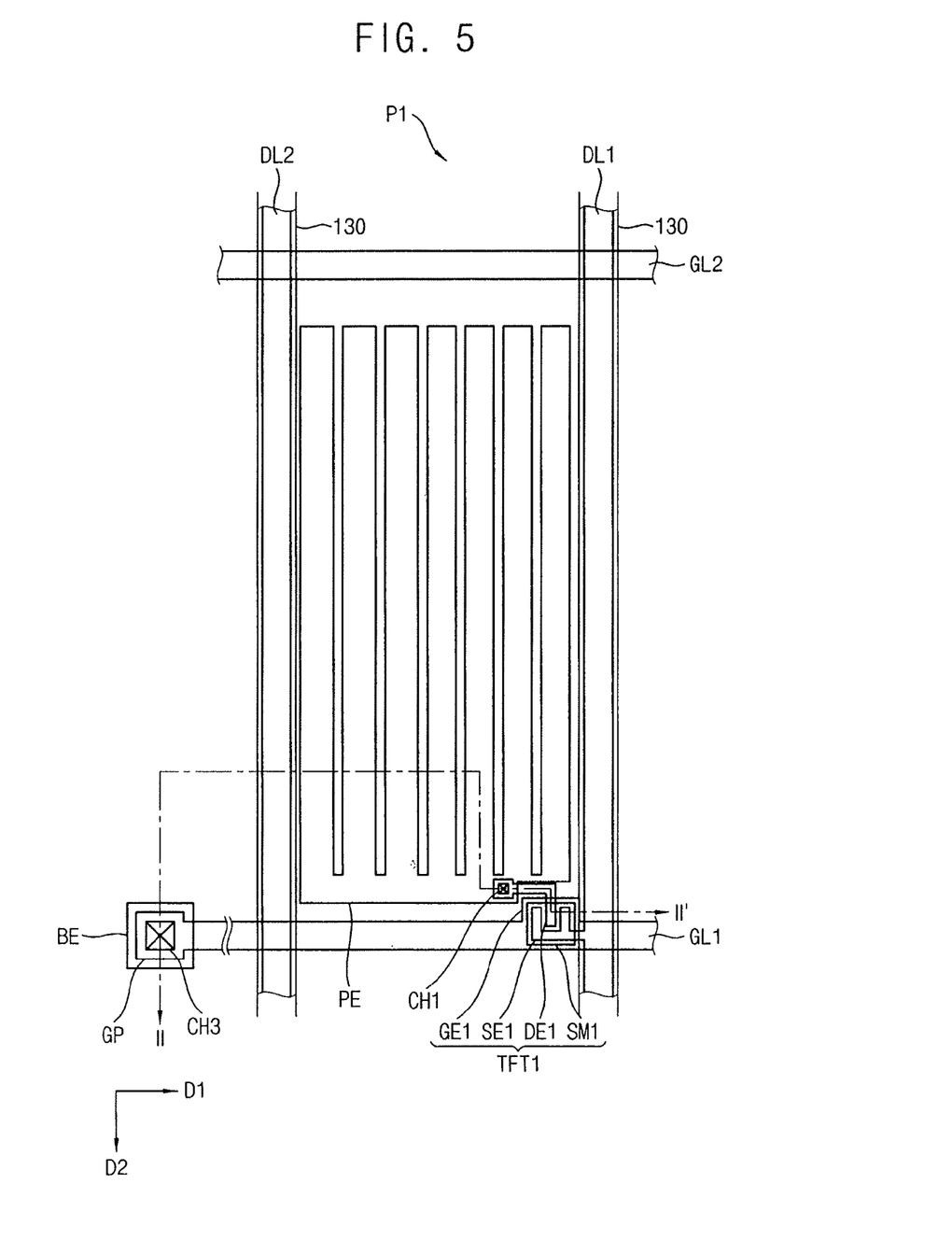
FIG. 5 illustrates a plan view of a first pixel included in the display panel of FIG. 1.
Figure 6:
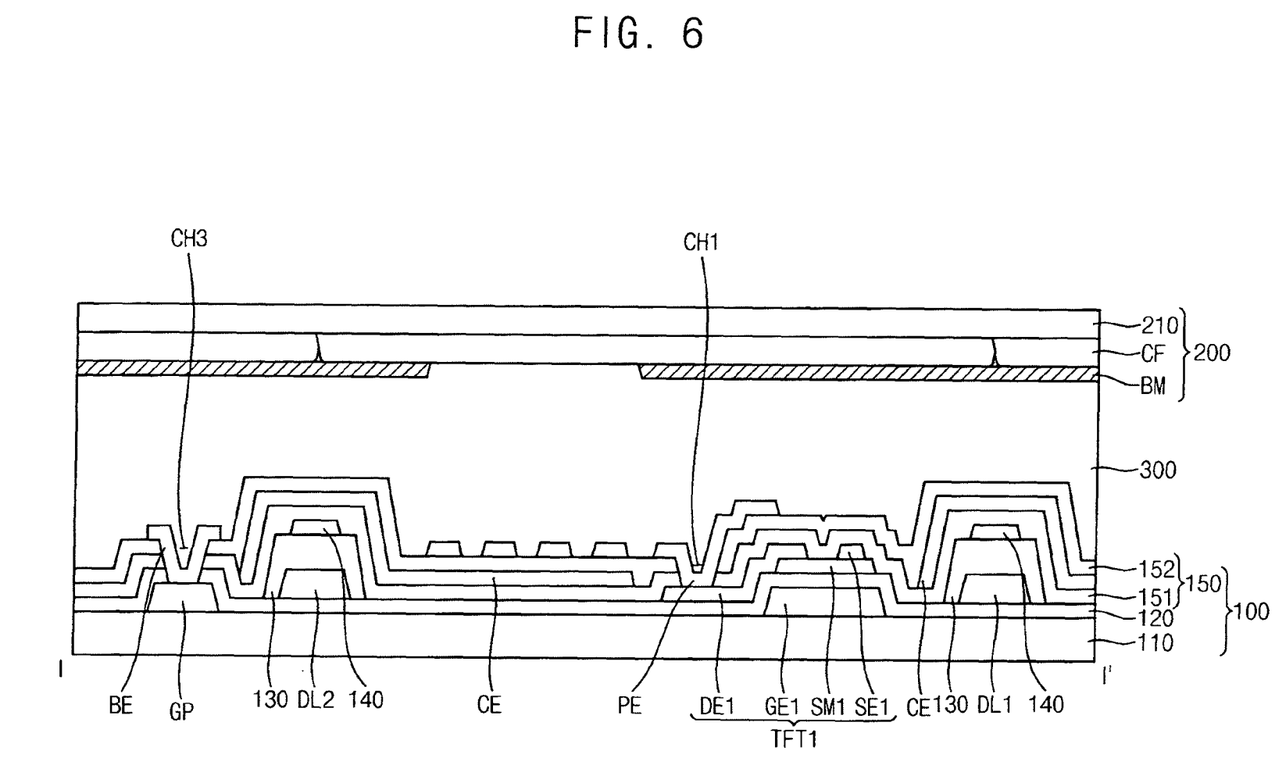
FIG. 6 illustrates a cross-sectional view of the display panel taken along the line II-II' of FIG. 5.

FIG. 5 illustrates a plan view of a first pixel included in the display panel of FIG. 1. FIG. 6 illustrates a cross-sectional view of the display panel taken along the line II-II' of FIG. 5.

The display panel according to exemplary embodiments in FIGS. 5 and 6 may be substantially the same as the display panel according to exemplary embodiments in FIGS. 1, 2 and 3, except that a common electrode may be disposed on a first base substrate. Thus, any further repetitive explanation concerning the above elements may be omitted.

Referring to FIGS. 5 and 6, the display panel may include a first substrate 100, a second substrate 200, and a liquid crystal layer 300.

The first substrate 100 may include a first base substrate 110, a first thin film transistor TFT1, a second thin film transistor TFT2, a gate insulating layer 120, a data line DL, an inorganic insulating pattern 130, a shielding electrode 140, a common electrode CE, a passivation layer 150, and pixel electrodes PE1 and PE2.

The passivation layer 150 may include a first passivation layer 151 and a second passivation layer 152.

The common electrode CE may be disposed on the first passivation layer 151.

For example, the common electrode CE may overlap with the data line DL. In this case, the shielding electrode 140 may be formed between the data line DL and the common electrode CE. Thus, a coupling capacitance between the data line DL and the common electrode CE may be reduced.

In an implementation, the common electrode CE may include a transparent conductor, e.g., indium tin oxide (ITO), indium zinc oxide (IZO), or aluminum-doped zinc oxide (AZO).

In an implementation, the common electrode CE may have a slit pattern.

The second passivation layer 152 may cover the common electrode CE. The second passivation layer 152 may insulate the common electrode CE and the pixel electrode PE.

The second passivation layer 152 may include inorganic insulating material. For example, the second passivation layer 152 may include silicon oxide (SiOx) or silicon nitride (SiNx).

The pixel electrode PE may be disposed on the second passivation layer 152.

The pixel electrode PE may be electrically connected to the thin film transistor through a contact hole. The pixel electrode PE may be connected to the drain electrode DE of the thin film transistor. A grayscale voltage may be applied to the pixel electrode by the thin film transistor.

The pixel electrode PE may overlap with the common electrode CE. Thus, a fringe field may be formed in the liquid crystal layer 300 by the common electrode CE (where a common voltage is applied) and the pixel electrode PE (where a grayscale voltage is applied). Thus, the display panel may operate in a plane to line switching (PLS) mode.

The second substrate 200 may include a second base substrate 210, a color filter CF, and a black matrix BM.

In an implementation, the display panel may include an alignment layer to facilitate aligning of the liquid crystal molecules.

The alignment layer may pretilt the liquid crystal molecules of the liquid crystal layer 300.

By way of summation and review, a liquid crystal display apparatus may include a liquid crystal display panel and a backlight unit. A gate pattern, a data pattern, and a pixel electrode may be formed on a substrate of the liquid crystal display panel. The data pattern may include a data line. A coupling capacitance may be generated between the data line and the pixel electrode or the common electrode overlapping with the data line, and then a data signal may be delayed. Thus, by forming a shielding electrode to overlap with the data line, the coupling capacitance between the data line and the pixel electrode or the common electrode may be removed or be reduced, and then the data signal may not be delayed.

An additional insulating layer may be disposed between the data line and the shielding electrode. A thickness of the insulating layer may be over a certain thickness to avoid a delay of a signal. However, the insulating layer may be etched thick to open a gate pad or a data pad, and then manufacturing cost may increase, and a size of a contact hole may increase.

The embodiments may provide a thin-film transistor substrate in which a contact pattern of a high resolution is formed.

The embodiments may provide a method of manufacturing the thin-film transistor substrate in which a process is simplified.

The above described embodiments may be used in a display apparatus including a thin film transistor and/or a system including the display apparatus, such as a LCD apparatus, an OLED apparatus, etc.

According to the example embodiments, the thin-film transistor substrate may include the shielding electrode on the data line. The thickness of the inorganic insulating layer may decrease, the contact hole may be formed easily, and the size of the contact hole may decrease. Thus, the resolution of the display panel may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin-film transistor substrate, comprising:
a base substrate that includes a plurality of pixel areas in a plurality of columns and a plurality of rows;
a gate line on the base substrate, the gate line extending in a row direction;
a data line on the gate line, the data line extending in a column direction;
a thin-film transistor connected to the gate line and the data line, the thin-film transistor including:
a gate electrode,
a semiconductor pattern,
a source electrode, and
a drain electrode, the semiconductor pattern overlapping with the gate electrode, the source electrode and the drain electrode overlapping with the semiconductor pattern, and the drain electrode being spaced apart from the source electrode;
an inorganic insulating pattern covering the data line, the inorganic insulating pattern including an opening extending in the column direction such that the opening is aligned with pixel areas in at least two columns;
a shielding electrode overlapping with the data line, the shielding electrode being directly on the inorganic insulating pattern;
a passivation layer covering the shielding electrode and the thin-film transistor and including a first contact hole; and
a pixel electrode on the pixel areas, the pixel electrode being electrically connected to the drain electrode through the first contact hole, wherein
the inorganic insulating pattern has a thickness of about 8,000 Å to about 10,000 Å and includes silicon oxide or silicon nitride, wherein
the passivation layer has a thickness of about 1,000 Å to about 3,000 Å, and wherein
the inorganic insulating pattern does not overlap with the pixel electrode.

2. The thin-film transistor substrate as claimed in claim 1, further comprising a gate insulating layer covering the gate line and the gate electrode.

3. The thin-film transistor substrate as claimed in claim 2, wherein the gate insulating layer has a thickness of about 3,000 Å to about 5,000 Å.

4. The thin-film transistor substrate as claimed in claim 1, wherein the shielding electrode includes a material that is substantially same as that of the pixel electrode.

5. The thin-film transistor substrate as claimed in claim 4, wherein the shielding electrode and the pixel electrode include indium tin oxide, indium zinc oxide, or aluminum-doped zinc oxide.

6. The thin-film transistor substrate as claimed in claim 4, wherein the shielding electrode and the pixel electrode are formed on different layers.

7. The thin-film transistor substrate as claimed in claim 1, wherein the pixel electrode has a slit pattern.

8. The thin-film transistor substrate as claimed in claim 1, further comprising:
a gate pad electrode connected to the gate line;
a gate insulating layer on the gate pad electrode;
a gate passivation layer on the gate insulating layer; and
a bridge electrode on the passivation layer,
wherein the bridge electrode is electrically connected to the gate pad electrode through a second contact hole.

9. The thin-film transistor substrate as claimed in claim 1, further comprising a common electrode overlapping with the pixel electrode.

10. A method of manufacturing a thin-film transistor substrate, the method comprising:
forming a gate pattern on a base substrate, the base substrate including a plurality of pixel areas, the gate pattern including a gate line and a gate electrode, and the gate line extending in a row direction;
forming a semiconductor pattern overlapping with the gate electrode;
forming a data pattern such that the data pattern includes a data line, a source electrode, and a drain electrode, the data line extending in a column direction, the source electrode and the drain electrode overlapping with the gate electrode, and the drain electrode being spaced apart from the source electrode;
forming an inorganic insulating layer by depositing an inorganic insulating material on the base substrate;
forming a shielding electrode directly on the inorganic insulating layer by using a photo pattern as a mask such that the shielding electrode overlaps with the data line;
forming an inorganic insulating pattern that covers the data line by etching the inorganic insulating layer such that etching of the inorganic insulating layer includes using the photo pattern and the shielding electrode as a mask, the inorganic insulating pattern including an opening extending in the column direction such that the opening is aligned with pixel areas in at least two columns;
forming a passivation layer by depositing the inorganic insulating material on the base substrate such that the passivation layer covers the shielding electrode, the source electrode, and the drain electrode;
forming a first contact hole by etching the passivation layer such that the first contact hole exposes the drain electrode; and
forming a pixel electrode that is electrically connected to the drain electrode through the first contact hole, wherein
the inorganic insulating pattern has a thickness of about 8,000 Å to about 10,000 Å and includes silicon oxide or silicon nitride, wherein
the passivation layer has a thickness of about 1,000 Å to about 3,000 Å, and wherein
the inorganic insulating pattern does not overlap with the pixel electrode.

11. The method as claimed in claim 10, further comprising forming a gate insulating layer by depositing the inorganic insulating material on the base substrate such that the gate insulating layer covers the gate pattern.

12. The method as claimed in claim 11, wherein the gate insulating layer is formed with a thickness of about 3,000 Å to about 5,000 Å.

13. The method as claimed in claim 10, wherein:
the gate pattern includes a gate pad electrode connected to the gate line, and
the method further includes:
forming a gate insulating layer on the gate pad electrode;
forming a gate passivation layer on the gate insulating layer;
forming a second contact hole by etching the gate insulating layer and the passivation layer such that the second contact hole exposes the gate pad electrode; and
forming a bridge electrode that is electrically connected to the gate pad electrode through the second contact hole.

* * * * *